United States Patent
Shei et al.

(10) Patent No.: US 7,120,571 B2
(45) Date of Patent: Oct. 10, 2006

(54) RESOURCE BOARD FOR EMULATION SYSTEM

(75) Inventors: Sweyyan Shei, Cupertino, CA (US);
Ming Yang Wang, LaFayette, CA (US);
Vincent Chiu, Fremont, CA (US); Neu Choo Ngui, Fremont, CA (US)

(73) Assignee: Fortelink, Inc., Fremont, CA (US)

( * ) Notice: Subject to any disclaimer, the term of this patent is extended or adjusted under 35 U.S.C. 154(b) by 446 days.

(21) Appl. No.: 10/735,342

(22) Filed: Dec. 11, 2003

(65) Prior Publication Data

US 2004/0254906 A1     Dec. 16, 2004

Related U.S. Application Data

(63) Continuation-in-part of application No. 10/463,057, filed on Jun. 16, 2003.

(51) Int. Cl.
G06F 9/455    (2006.01)
G06F 17/50    (2006.01)

(52) U.S. Cl. ............... 703/23; 703/25; 716/16
(58) Field of Classification Search ............ 703/23
See application file for complete search history.

(56) References Cited

U.S. PATENT DOCUMENTS

| | | | | |
|---|---|---|---|---|
| 4,974,226 A | * | 11/1990 | Fujimori et al. | 714/726 |
| 5,671,432 A | * | 9/1997 | Bertolet et al. | 712/11 |
| 5,907,697 A | * | 5/1999 | Barbier et al. | 716/16 |
| 6,026,230 A | | 2/2000 | Lin et al. | |
| 6,034,538 A | * | 3/2000 | Abramovici | 326/38 |
| 6,275,499 B1 | * | 8/2001 | Wynn et al. | 370/438 |
| 6,539,438 B1 | * | 3/2003 | Ledzius et al. | 710/8 |
| 6,604,230 B1 | * | 8/2003 | Khalid et al. | 716/16 |
| 6,651,225 B1 | * | 11/2003 | Lin et al. | 716/4 |
| 6,754,763 B1 | * | 6/2004 | Lin | 710/317 |
| 6,832,185 B1 | * | 12/2004 | Musselman et al. | 703/23 |
| 2001/0010036 A1 | * | 7/2001 | Stewart et al. | 703/23 |
| 2003/0074178 A1 | * | 4/2003 | Sample et al. | 703/25 |

OTHER PUBLICATIONS

Morris, J.N. 'AnyBoard: an FPGA-Based, Reconfigurable System'. Design & Test of Computers, IEEE, Sep. 1992, vol. 9. pp. 21-30.*
Mohammed Khalid. 'Routing Architecture and Layout Synthese for Multi-FPGA Systems'. 1999.*

* cited by examiner

*Primary Examiner*—Fred Ferris
*Assistant Examiner*—Shambhavi Patel
(74) *Attorney, Agent, or Firm*—Daniel J. Bedell; Smith-Hill and Bedell (57) ABSTRACT

A resource board for a circuit emulator holds programmable logic devices (PLDs) and other emulation resources such as random access memories (RAMs) and employs both hard-wired and network-based virtual signal paths to flexibly route signals between the emulation resources on the resource board and resources mounted on other resource boards, workstations and other external equipment. The resource board also provides the logic and balanced signal paths needed to deliver clock signals to the PLDs and reduces the number of signals needed to communicate with external test equipment by implementing much of the pattern generation and data acquisition functionality needed to test an emulated circuit.

25 Claims, 7 Drawing Sheets

RESOURCE BOARD FOR EMULATION SYSTEM

CROSS-REFERENCE TO RELATED APPLICATIONS

The present application is a continuation-in-part of copending application Ser. No. 10/463,057 filed Jun. 16, 2003 and incorporated herein by reference.

BACKGROUND OF THE INVENTION

1. Field of the Invention

The present invention relates to systems employing programmable logic devices and other resources to emulate the behavior of an electronic circuit, and in particular to a circuit board for providing emulation resources for an emulation system.

2. Description of Related Art

A typical digital integrated circuit (IC) employs register transfer logic (RTL) wherein each block of logic within the IC includes an output register for synchronizing state changes in its output signals to edges of a clock signal. An IC designer will usually generate an initial, high-level netlist employing Boolean expressions to characterize each block of logic. The designer will then employ a synthesis tool to convert the high level netlist into a "gate level" netlist describing the logic blocks as sets of interconnected cells, where each cell is a standard IC component such as a transistor or a logic gate. The gate level netlist references each cell instance to be included in the IC by referring to an entry for that cell type in a cell library, a database including an entry for each kind of cell that can be included in an IC. The cell library entry for each cell type describes the internal layout of the cell and includes a model of the cell's behavior. After synthesizing the gate level netlist, the designer employs a placement and routing (P&R) tool to convert the gate level netlist into an IC layout file indicating the position within a semiconductor die of each cell forming the IC and describing how the nets are to be routed between cell terminals. The layout file guides IC fabrication.

An IC designer can use computer-aided simulation and verification tools at each step of the design process to verify that the IC described by the design will behave as expected. For example, to use a circuit simulator, the designer develops a "testbench" incorporating a netlist describing the IC to be simulated and indicating how the IC's input signals are to change state over time. The testbench will also list various signals of the IC to be monitored during the simulation. For gate level netlists, the simulator creates a behavioral model of the IC based on the testbench description of the IC and on behavioral models of the IC's cells obtained from the cell library, and then tests the IC model to determine how the monitored signals would respond to input signal patterns the testbench describes. During the test, the simulator generates a "dump file" containing waveform data representing the time-varying behavior of the monitored signals. The designer can then use various debugging tools to inspect the dump file to determine whether the IC behaved as expected.

Although a simulator can accurately model the behavior of an IC based on either a high-level or gate-level netlist, it can require much processing time to simulate IC behavior. To reduce simulation time a designer can program a simulator to simulate only selected portions of an IC design that are new or have been modified, but this approach may not provide any assurance that the new and old portions of the design will work properly together.

Emulation Systems

Another way to reduce the time needed to verify the IC logic a netlist describes is to use programmable logic devices (PLDs) and other hardware devices to emulate the IC logic. For example U.S. Pat. No. 6,377,911 issued Apr. 23, 2002 to Sample et al, describes a logic emulation system employing field programmable gate arrays ("FPGAs") that can be programmed to emulate IC logic. Since FPGAs employ high-speed logic gates and other devices to emulate circuit behavior, an emulation system using FPGAs can usually verify IC behavior more quickly than a simulator.

Figure 1:
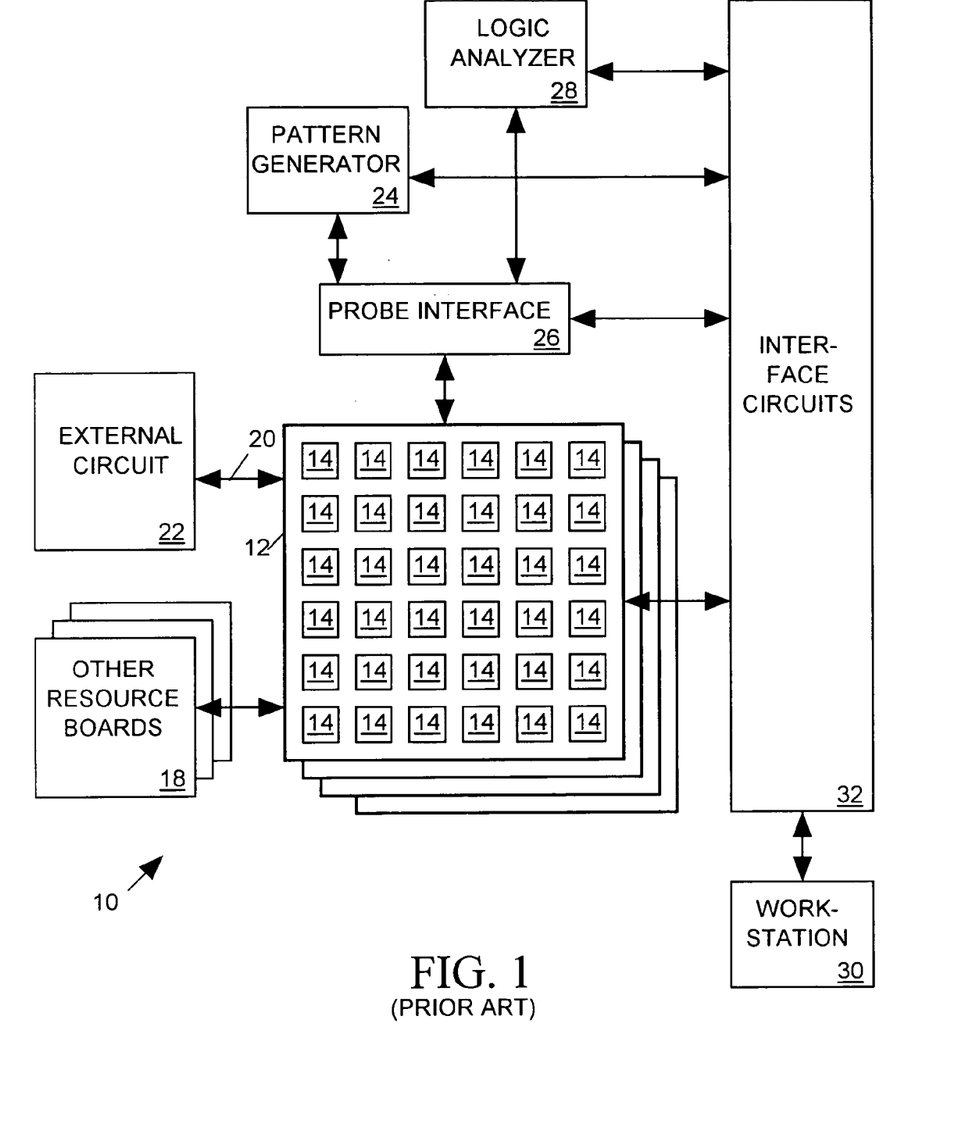
FIG. 1 illustrates a typical prior art emulation system in block diagram form.

FIG. 1 illustrates a typical prior art emulation system 10 including a set of circuit boards 12 each holding an array of FPGAs 14, each of which can be programmed to emulate the logic of a large number of interconnected logic gates, flip-flops and registers. Each FPGA 14 has many input/output (IO) terminals and many of those IO terminals are linked to IO terminals of other FPGAs 14 on the same circuit board 12 so that the FPGAs can communicate with one another. Since ICs may include large standardized components such as embedded computer processors and memories, emulation system 10 may include processors, memory ICs or other devices mounted on other resource boards 18 for emulating those large IC components. Cable connectors or backplane typically provide signal paths between FPGAs 14 and other resources mounted on resource boards 12 and 18.

When emulator 10 is to act as an in-circuit emulation ("ICE") system, it emulates an IC within its intended operating environment, installed on a circuit board of an external system so that it can communicate with other devices within that system. A cable 20 links IO terminals of some of FPGAs 14 to a socket of an external system 22 of the type in which the IC being emulated will eventually reside.

To test the emulated IC, an external pattern generator 24 supplies test signal inputs to FPGAs 14 though a probe interface circuit 26 programmed to route the test signals to the appropriate FPGA terminals. A logic analyzer 28 monitors various signals the emulated IC produces through signal paths provided by probe interface circuit 26 provides. A user programs FPGAs 14, pattern generator 24, and probe interface 26 and communicates with logic analyzer 28 through a workstation 30 linked to those devices through a suitable interface circuits 32 such as for example, the workstations serial ports and JTAG bus interfaces.

Resource Interconnections

Figure 2:
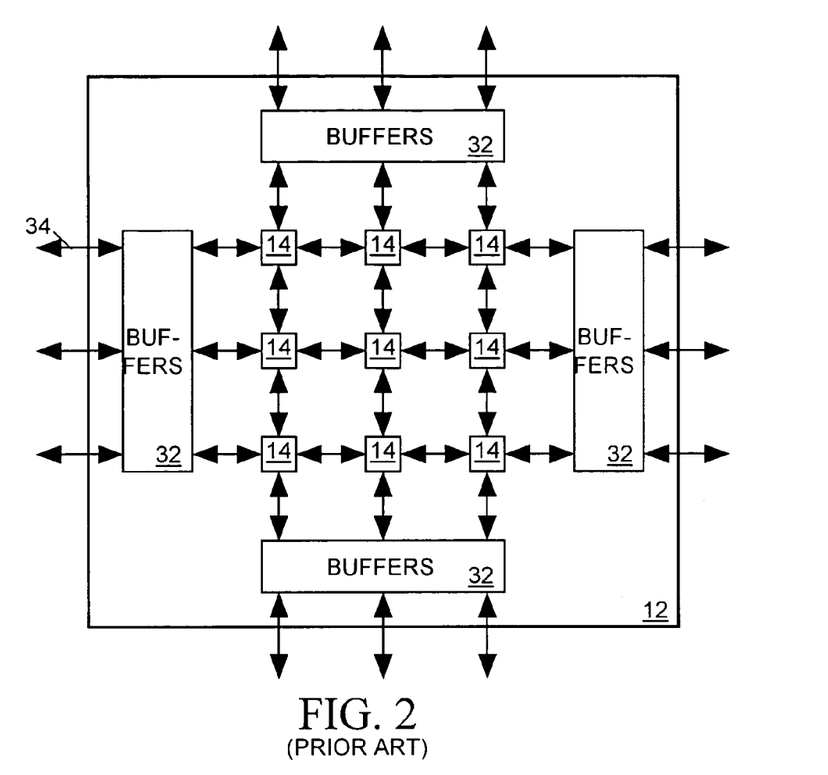
FIGS. 2 and 3 illustrates in block diagram form typical prior art systems for interconnecting devices on emulation system resource boards.

Each FPGA 14 will have a large number of IO terminals and each circuit board 12 must provide signal paths between the FPGAs and between the FPGAs and external equipment so that they can communicate with one another. FIG. 2 illustrates one prior art approach to routing signals between FPGAs wherein traces on circuit board 12 connect IO terminals of each FPGA 14 to IO terminals of many or all of the other FPGAs 14. Buffers 32 mounted on circuit board 12 buffer signals passing between circuit board 12 and other resource boards and test equipment via cables or motherboard backplane wiring 34. This hard-wired approach to FPGA interconnects is relatively inexpensive, but not very flexible since the number of direct signal paths between each pair of FPGA 14, and between the resource board and other resource boards or test equipment is fixed. In cases where there are no direct signal paths between two FPGAs 14 that are to communicate with one another, or for which there are an insufficient number of direct signals paths, additional signals can be routed through interposing FPGAs, however in such case some of the FPGA resources will be expended on signal routing duties and be unavailable for logic emulation.

Figure 3:
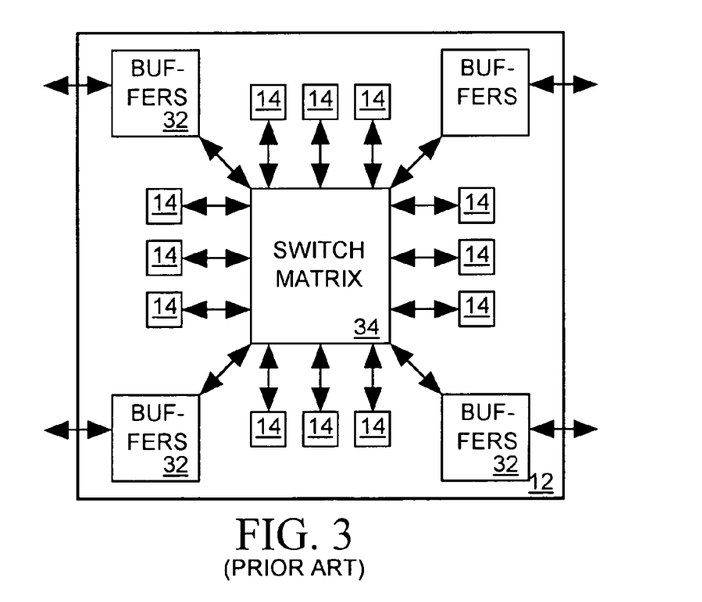

FIG. 3 illustrates another prior art approach to signal routing between FPGAs 14 wherein the IO terminals of FPGAs 14 and the external signal buffers 32 all communicate through a switching matrix 34, such as a crosspoint switch, mounted on circuit board 12. The switch matrix approach provides more flexible routing than the fixed routing of FIG. 2 because it allows any FPGA terminal to directly communicate within any other FPGA terminal or any external resource. But since the number of signal paths switch matrix 34 must provide is proportional to the square of the number of FPGA terminals and buffered signal paths to be interconnected, the necessary switch matrix size becomes impractically large for a circuit board having a large array of FPGAs, each having a large number of IO terminals.

What is needed is an emulation resource board for holding PLDs and other resources and for flexibly routing signals between the PLDs on the resource board and between those PLDs and resources mounted on other resource boards, computers and other external equipment at a reasonable cost and without having to use the FPGA resources signal routing. The resource board should also provide the logic and balanced signal paths needed to deliver clock signals to the PLDs. It would also be helpful to reduce the number of signals needed to communicate with external equipment by implementing much of the pattern generation and data acquisition functionality needed to test an emulated circuit on the resource board itself.

BRIEF SUMMARY OF THE INVENTION

The invention relates to a resource board (a circuit board containing emulation resources) for an emulation system that may include several such resource boards and one or more workstations. Each resource board communicates with other resource boards and with one or more workstations through data packets transmitted over a network. Each resource board includes a "network/resource interface circuit" acting as an interface between the network and emulation resources such as field programmable gate arrays (FPGAs) or other types of programmable logic devices (PLDs) mounted on the resource board.

The packet routing network and the network/resource interface circuits provide "virtual signal paths" between input and output terminals of resources mounted on separate resource boards. For example, a network/resource interface circuit of one resource board can monitor output signals of PLDs mounted on that resource board and send packets containing data indicating the states of those output signals to a network/resource interface circuit of another resource board. The packet receiving network/resource interface circuit can then drive signals supplied to input terminals of selected PLDs mounted on its local resource board to states indicated by the data conveyed in the packets.

A "local bus" formed on the resource board connects the network/resource interface circuit to several input/output (IO) terminals of each PLD to allow the network/resource interface circuit to transmit input signals to each FPGA and to monitor output signals produced by each FPGA when the network/resource interface circuit is providing virtual signals paths between an FPGA and resources external to the resource board. Thus, although the input and output terminals of the resources mounted on separate resource boards are not directly interconnected by signal paths, the virtual signal paths allow them to act as if they were.

When a workstation is to emulate a portion of the IC, the packet routing network can also provide virtual signal paths between the workstation and the resource boards. The workstation can also send PLD programming data via packets to the network/resource interface circuit on each resource board, with each packet being addressed to a particular PLD to be programmed. A "select map" bus connected between the network/resource interface circuit and each PLD on the board allows the network/resource interface circuit to forward programming data arriving in a packet to the addressed PLD. Thus an emulation resource board in accordance with the invention provides a convenient way to interface a workstation to emulation resources on the board to allow the workstation to program the emulation resources on the board and to also emulate a portion of the IC being emulated and to program the emulation resources on the board.

A resource board in accordance with a preferred embodiment of the invention includes several FPGAs or other types of PLDs and a separate random access memory (RAM) corresponding to each FPGA. A set of switches controlled by the network/resource interface circuit in response to control data received via incoming packets selectively couple terminals of each FPGA to its corresponding RAM, thereby allowing circuits emulated by the FPGA to read and write access the RAM so that the RAM can emulate memory embedded in the circuit being emulated.

A workstation can also program the resource board's network/resource interface circuit to act as a pattern generator supplying test signal inputs to the portions of the circuit being emulated on the resource board. The network/resource interface circuit includes RAM for storing data for controlling the signal patterns it is to generate during the emulation, and a workstation can load the pattern control data into the RAM prior to the start of the emulation by sending it in packets to the network/resource interface circuit. The network/resource interface circuit can also act as a data acquisition system by monitoring PLD output signals and storing "probe data" in its RAM representing PLD output signal state sequence that occur during an emulation. The network/resource interface circuit can then forward the probe data in packets to a workstation for analysis. A "probe bus" formed on the resource board, connects several other IO terminals of each PLD to the network/resource interface circuit to enable the network/resource interface circuit to send test signals to and monitor output signals from the PLD.

A workstation can also program the network/resource interface circuit to act as a clock logic circuit for deriving signals for clocking logic within the PLDs from number of clock signal sources. A clock bus formed on the resource board delivers clock signal edges concurrently from the network/resource interface circuit to each PLD and also delivers gating signals from each PLD back to the network/resource interface circuit.

With the packet routing network providing virtual signal paths between resource boards, it is necessary only to connect the boards to the network using conventional network cables in order to allow any resource mounted on any one resource board to communicate with any resource mounted on any other resource board. However each resource board includes connectors allowing cables to provide high-bandwidth hard-wire paths between PLD IO terminals on that resource board and other resources when necessary. The cable connectors can also be used to connect terminals of the PLDs to an IC socket in a target circuit board when the emulation system is to act as an in-circuit emulator.

Thus an emulation resource board in accordance with the invention holds PLDs and RAMs and employs both hardwired and virtual signal paths to flexibly route signals between the PLDs and RAMS on the resource board and between the PLDs and other resource boards, workstations and other external equipment. The resource board also provides the logic and balanced signal paths needed to deliver clock signals to the PLDs and reduces the number of signals needed to communicate with external test equipment by implementing much of the pattern generation and data acquisition functionality needed to test an emulated circuit.

The claims appended to this specification particularly point out and distinctly claim the subject matter of the invention. However those skilled in the art will best understand both the organization and method of operation of what the applicant(s) consider to be the best modes of practicing the invention, together with further advantages and objects of the invention, by reading the remaining portions of the specification in view of the accompanying drawings wherein like reference characters refer to like elements.

DETAILED DESCRIPTION OF THE INVENTION

The present invention relates to a network-based emulation system using various programmable resources to emulate the behavior of an IC to determine how signals an IC produces would behave in response to test signals applied as inputs to the IC. The invention relates in particular to a circuit board employed by the emulation system for holding emulation resources, for providing programming and data signal paths to the resources, and for providing some test functions needed during a circuit emulation. While the specification below and the accompanying drawings depict an example embodiment of an emulation resource board considered to be a best mode of practicing the invention, those of skill in the art will appreciate that the invention may be practiced in other ways. The claims appended to this specification therefore apply not only to the example embodiment described below but to any embodiment of the invention including elements or steps that may be functional equivalents of the example elements or steps of the exemplary embodiment of the invention depicted in the specification and drawings.

Emulation System Architecture

Figure 4:
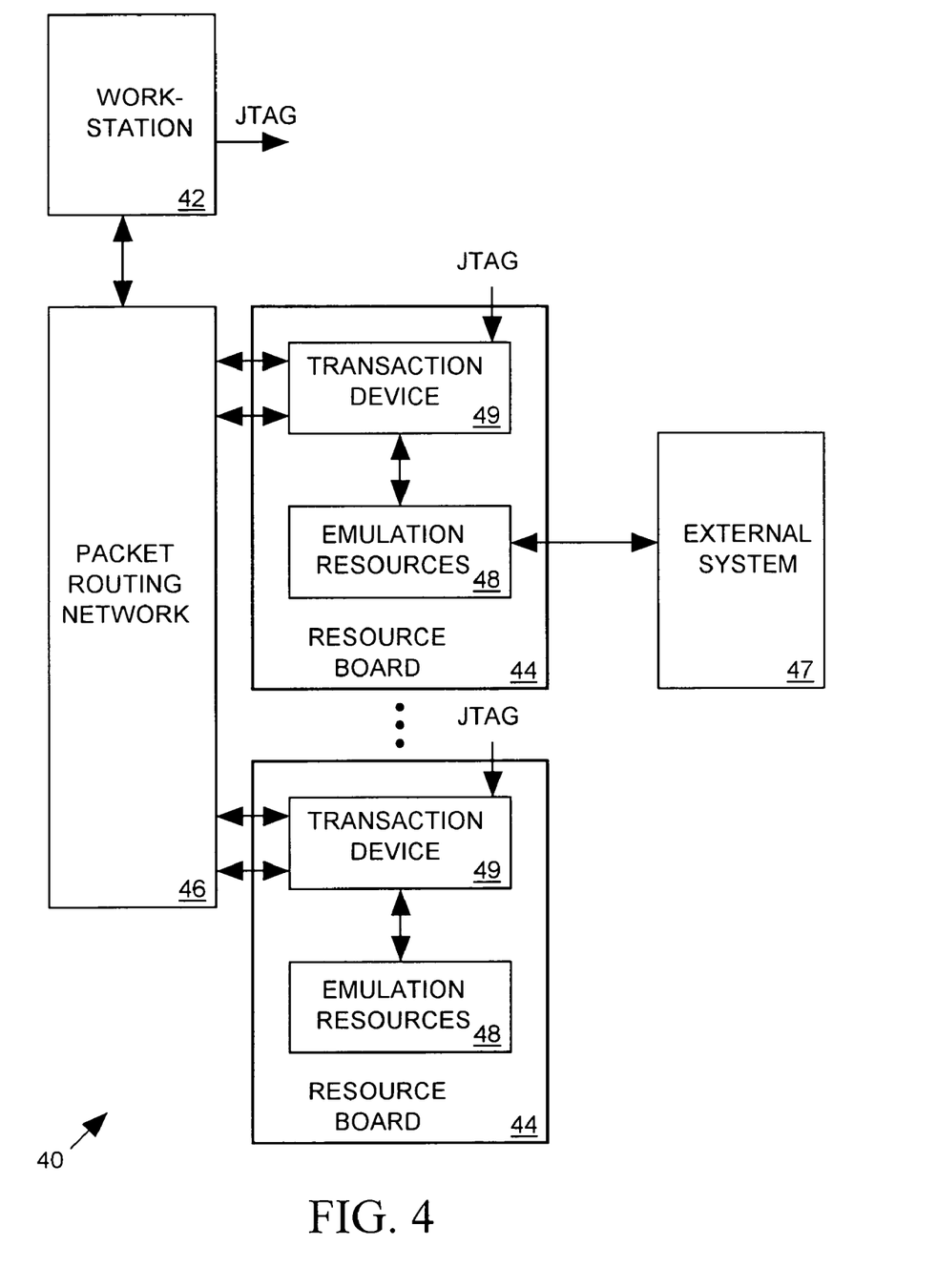
FIG. 4 illustrates in block diagram form, an emulation system employing resources boards in accordance with the invention.

FIG. 4 illustrates an example emulation system 40 in accordance with the invention including a computer workstation 42, one or more "resource boards" 44, and a packet routing network 46 comprising one or more network buses that may be interconnected by conventional network routers, switches or hubs. Each resource board 44 holds one or more emulation resources 48 for use in emulating portions of an IC. Emulation resources 48 may include, for example, programmable gate arrays (FPGAs) or other types of programmable logic devices (PLDs), random access or read only memories, application specific integrated circuits (ASICs), microprocessors or any other devices suitable for emulating portions of an IC at various levels of abstraction. Each resource board 44 also includes a "network/resource interface circuit" 49 for providing an interface between packet routing network 46 and emulation resources 48.

Workstation 42 and network/resource interface circuit 49 may transmit packets to one another via packet routing network 46. Various types of networks known to those of skill in the art can implement packet routing network 46, and each packet is arranged in accordance with the particular physical layer protocol the network uses. However, each packet will typically include a header containing information the network needs to route the packet to the appropriate destination, along with the payload data the packet is to convey to the recipient. Workstation 42, each network/resource interface circuit 49, and each emulation resource 48 has a unique network address, and the header included in each data packet transmitted via packet routing network 46 suitably indicates the network addresses of the devices designated as the source and destination of the packet. 42. The header also includes a command telling the recipient network/resource interface circuit or workstation to carry out some type of an action. The packet's payload data acts as an argument to the command included in the header and may be of fixed or variable length depending on the nature of the network's physical layer protocol, though variable length packets are preferable. For example, if the command tells a receiving network/resource interface circuit 49 to drive particular signals of an addressed emulation resource 48 to particular states, then the payload constituting the command's argument will reference those signals and indicate the states to which they are to be driven. A network/resource interface circuit 49 will execute the command in an incoming packet only if the network destination address included in the packet header matches the address of any emulation resource 48 on the local resource board 44.

The network/resource interface circuit 49 of each resource board 44 not only transmits and receives packets but also communicates with the local emulation resources 48 on that resource board. Since the types of transactions each network/resource interface circuit 49 carries out during an emulation depends to some extent on the nature of the circuit to be emulated, each network/resource interface circuit 49 includes one or more programmable logic devices that can be programmed to carry out various functions during a circuit emulation network/resource interface circuit's 49 are initially loaded with a boot program supplied from an external source through a JTAG or other type of bus, or via a programmable read only memory to enable the network/resource interface circuit to communicate via packet routing network 46. With the boot program loaded into network/resource interface circuit 49, workstation 42 can thereafter reprogram network/resource interface circuit 49 using programming data conveyed by incoming packets addressed to network/resource interface circuit 49.

Packets from a workstation also convey emulation resource programming data. For example when emulation resources 48 includes FPGAs, workstation 42 addresses packets conveying a "download" command and FPGA programming data to the particular FPGAs to be programmed. The network/resource interface circuit 49 on the resource board 44 containing an addressed FPGA responds to the download command in the incoming packet by forwarding the packet's payload programming data to the programming input of that FPGA.

A packet may convey data indicating current states of resource output signals or indicating state to which resource input signals are to be driven. For example a "read" command in an incoming packet can tell a network/resource interface circuit 49 to return a signal data packet to the source address containing payload data indicating states of signals at various IO terminals of an FPGA addressed by the incoming packet's destination address. A "force" command in a packet can tell a receiving network/resource interface circuit 49 to drive specified IO terminals of an emulation resource addressed by the packet's destination address to particular states. A sequence of packets containing force commands can emulate the behavior of signal paths between output terminals of emulation resources 48 on the resource board 44 sending the packets and input terminals of emulation resources 48 on the resource board to which the packets are addressed. Thus the force commands implement "virtual signal paths" between IO terminals of resources mounted on separate emulation boards so that emulate the logical behavior of hard-wired signal paths.

In a "co-validation mode of operation", workstation 42 (or any other computer accessing packet routing network 46) can emulate some portions of an IC while emulation resources 48 on resource boards 44 emulate other portions of the IC. In that mode of operation, workstation 42 and network/resource interface circuits 49 can use packets conveying force commands to drive signal inputs to resources within various modules.

A resource board 44 may include a large amount of random access memory that can, for example, emulate the function of a large memory bank. In such case, a write command conveyed in an incoming packet's header might tell network/resource interface circuit 49 to write data to a particular address or a block of addresses within the memory selected by the packet's destination address. The packet's data payload references the memory address or addresses to be accessed as well as the data to be written to that memory address. A memory read command in an incoming packet tells a network/resource interface circuit 49 to read data at a particular address or block of addresses of a memory addressed by the destination address and to return the data read out of the memory in a packet addressed to the device identified by the source address included in the incoming packet's header. Thus the packet routing system can implement a "virtual memory bus" enabling the workstation or any emulation resource to read or write access a memory mounted on a resource board.

Emulation system 40 can act as an in-circuit emulator (ICE) emulating an IC in its intended operating environment, installed in a socket within an external "target system" 47 such as a circuit board containing other components. In an ICE operating mode emulation resources 48 communicate directly with external system 47, for example, through signal paths provided by a cable having a connector that plugs into the socket within target system 47 normally intended to hold the IC being emulated.

Resource Board

Figure 5:
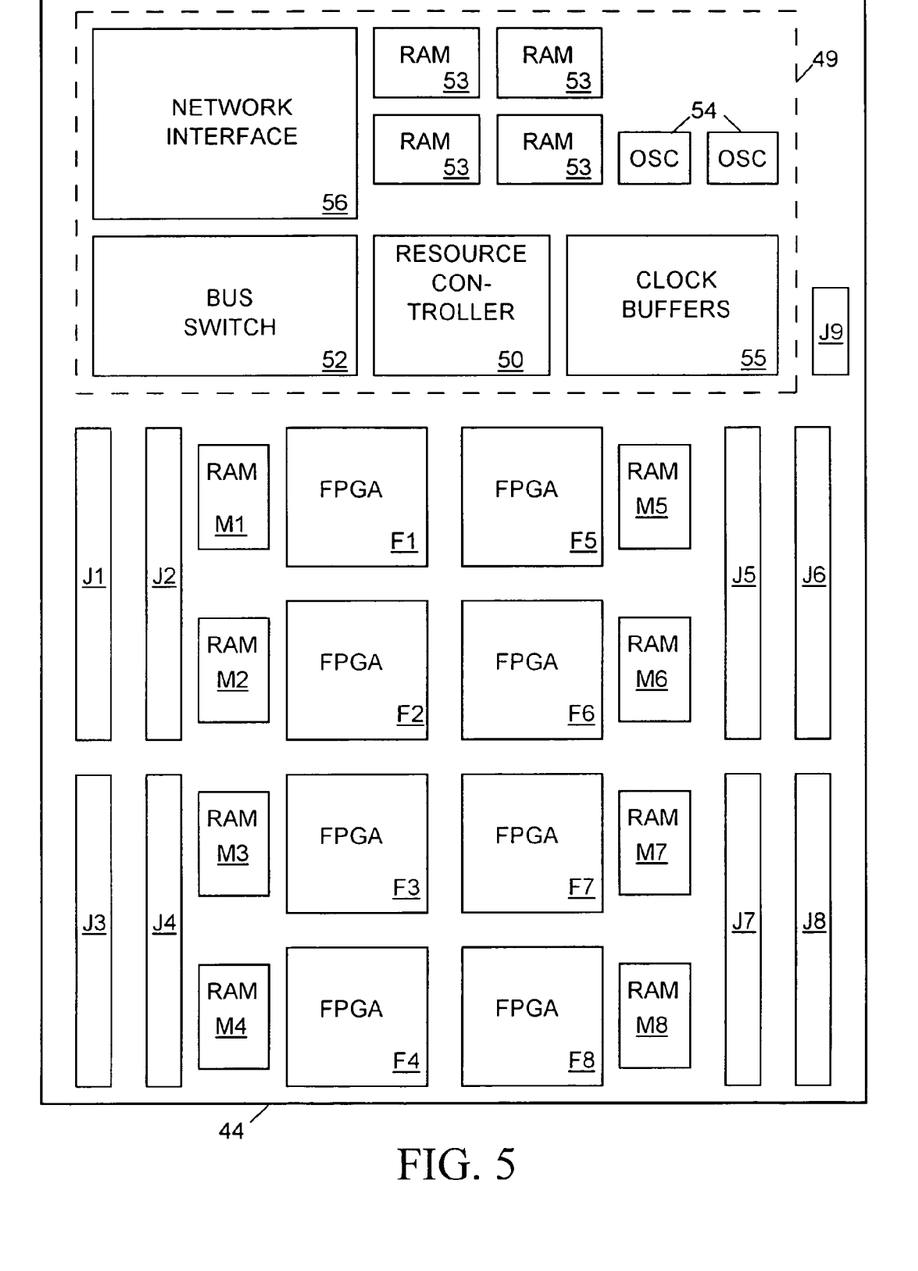
FIG. 5 is a simplified plan view of an example resource board in accordance with the invention.

FIG. 5 is a plan view of an example resource board in accordance with the invention suitable for use as one of resource boards 44 of FIG. 3. The emulation resources mounted on resource board 44 include a set of eight FPGAs F1–F8 and a set of eight RAMs M1–M8. The board's network/resource interface circuit 49 includes a resource controller 50, a bus switch 52, a set of RAMs 53 (suitably high-speed SDRAMs, DDRs or QDRs), a pair of oscillators 54, an input/output clock buffer IC 55 and a network interface circuit 56. Network interface 56 handles packet communications between network 46 and resource controller 50. Each FPGA F1–F8 is suitably an Xilinx model Virtex-II 6000 FF1517 having 1104 IO pins and providing up to 400K gates, however other FPGA makes and models and be used. Other types of PLDs could also be mounted on the resources board in addition to or in lieu of FPGAs F1–F8. Resource controller 50, suitably implemented by a boot PROM and a Xilinx Virtex-II FPGA, has several functions as discussed below.

Resource controller 50 programs FPGAs F1–F8 with programming data workstation 42 sends via packets to network interface 56. Each FPGA F1–F8 has its own network address, and before the start of an emulation, resource controller 50 forwards the programming data addressed to each FPGA that is to take part in the emulation. The network interface 56 on each resource board 44 forwards FPGA programming data addressed to any of local FPGAs F1–F8 to resource controller 50, and the resource controller 50 loads the programming data into the addressed FPGA.

During an emulation, resource controller 50 can act as a programmable pattern generator providing test signal inputs to the IC being emulated. Before the start of the emulation process, workstation 42 or any other device accessing the packet routing network, loads data into RAMs 53 defining the test signal patterns resource controller 50 is to generate during the emulation. Resource controller 50 then reads the programming data out of RAMS 53 during the emulation to determine how to control the test signals it supplies to FPGAs F1–F8. Resource controller 50 can also act as a data acquisition system during an emulation, sampling signals FPGAs F1–F8 produce during an emulation and storing "probe data" in RAMs 53 indicating the states of those signals. At various times during the emulation, or when the emulation is complete, resource controller 50 can read the probe data out of RAMs 53 and forward it via packets to workstation 42. Workstation 42 can then use the probe data as a basis for analyzing the behavior of the emulated IC, for producing waveform displays, or for any other purpose.

During an emulation, resource controller 50 can communicate with workstation 42 and with resource controllers on other resource boards using packets sent and received over packet routing network 46 (FIG. 4) and network interface circuit 56. For example, suppose workstation 42 has programmed FPGAs mounted on different resource boards to implement separate portions of an IC and that IO terminals of those separate portions are to communicate with one another through a set of signals. Resource controller 50 can monitor output signals of FPGAs F1–F8 on resource board 44 that are to act as input signals to FPGAs or other devices on another resource board and, following each cycle of a system clock, can send a force command packet to the other resource board containing data indicating the state of each FPGA output signal. The force command tells the resource controller on the other resource board to drive the appropriate input signals of its emulation resources to the indicated states at the start of the next system clock cycle.

Conversely, when emulation resources on another resource board produce output signals that are to act as input signals to one or more of FPGAs F1–F8, resource controller 50 can respond to a force command packet from the resource controller on the other circuit board by driving the appropriate FPGA inputs to the states indicated by the state data in the incoming write command packet. Resource controller 50 can also send or respond to "read command" packets requesting a recipient controller to read states of signals produced by local emulation resources and return a response packet containing data indicating those signals states. During an emulation, software running on workstation 42 can emulate a portion of an IC. In such case, workstation 42 can communicate with resource boards 44 through read and write packets to emulate the signals passing between the portions of the IC the workstation and resources boards emulate. Thus during an emulation, packet routing network 46 and the network/resource interface circuit 49 each resource board 44 (including network interface 56 and resource controller 50) can act as a set of "virtual signal paths" that appear to interconnect terminals of portions of an IC being emulated by workstation 42 and the separate resource boards 44.

Resource board 44 also includes a set of connectors J1–J8, each linked by conductive traces on the board to terminals of a corresponding one of FPGAs F1–F8. When, for example, IO terminals of FPGA F1 are to communicate via with resources on another resource board, and the bandwidth of those signals is too high for virtual signal paths, a cable connected between connector J1 and a connector on the other resource board can provide high bandwidth, hard-wire signal paths between FPGA F1 and other resource board. The emulation system may act as an in-circuit emulation (ICE) system, emulating an IC when mounted in its intended operating environment, for example, mounted in a socket on a target board. In such case a cable connected between the target board socket and any subset of connectors J1–J8 can provide the necessary signal paths between resource board 44 and the target board.

Resource Board Signal Paths

Traces and vias formed on and through various layers of resource board 44 provide signal paths between the components mounted on the resource board. FIGS. 6–11 illustrate various signal paths provided on resource board 44.

Figure 6:
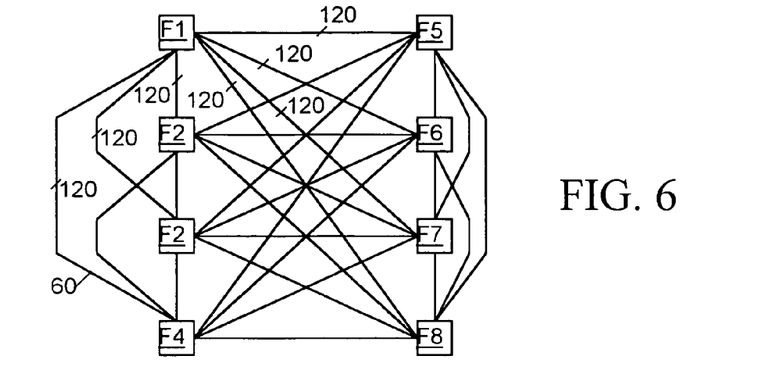
FIGS. 6–11 illustrate various interconnect systems employed on the resource board of FIG. 5 in block diagram form.

As illustrated in FIG. 6, traces 60 link a set of 120 IO terminals of each FPGA F1–F8 to each of the other seven FPGA's. In the preferred embodiment of the invention, each FGPA F1–F8 is suitably an Xilinx model Virtex-II 6000 FF1517 having 1104 IO terminals, and traces 60 suitably hard wire a total of 840 IO terminals of each FPGA F1–F8 to IO terminals of the other FPGAs.

Figure 7:
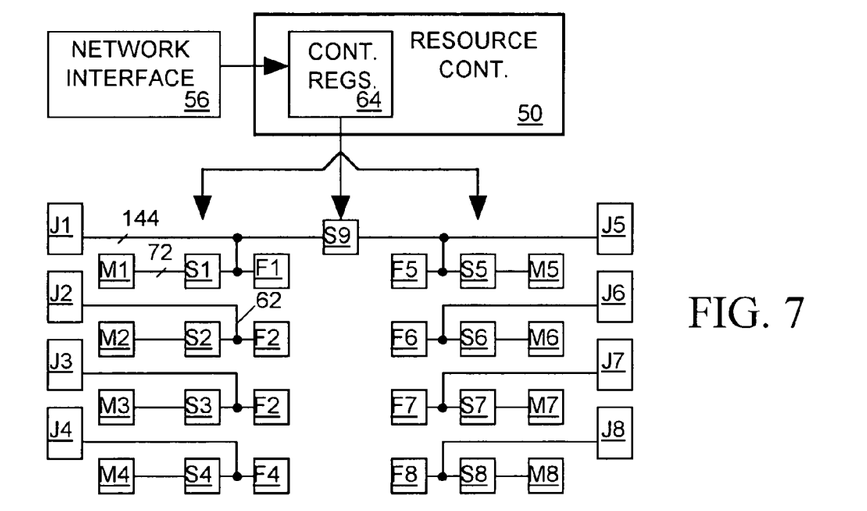

As illustrated in FIG. 7, traces 62 link 144 IO terminals of each FPGA F1–F8 to a corresponding one of connectors J1–J8 and, through a switch S1–S8, to a corresponding one of RAMs M1–M8. Bus switch 52 of FIG. 5 implements switches S1–S8, and an additional switch S9 linking connectors F1 and F5. Control data stored in control registers 64 within resource controller 50 control the switching states of switches S1–S9. When programming the emulation system, workstation 42 (FIG. 3) sends a packet to resource board 44 telling it to load appropriate control data into registers 64. When none of RAMs M1–M8 are needed during an emulation, switches S1–S8 are open, but when any of FPGAs F1–F8 are to access its corresponding one of RAMs M1–M8 during a emulation, its corresponding switch S1–S8 remains closed to provide the necessary signal paths between the FPGA and its corresponding RAM. When more than 120 direct signal paths are needed between FPGAs F1 and F5, switch S9 can be closed to provide an additional 144 signal paths between those two FPGAs. A cable connected to any of connectors J1–J8 can link up to 144 IO terminals of its corresponding FPGA F1–F8 to terminals of external devices that are to directly communicate with the FPGAs. Also a circuit board or cable plugged into and providing signal paths between connectors J1–J8 can be used when necessary to increase the number of direct connections between any set of FPGAs F1–F8.

Figure 8:
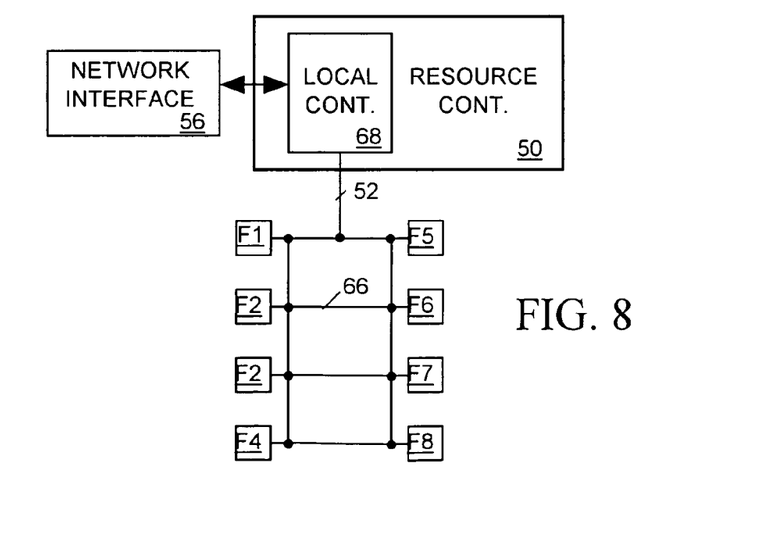

As illustrated in FIG. 8, 52 IO terminals of resource controller 50 and each of FPGAs F1–F8 are connected in parallel to 52 separate lines of a "local bus" 66 implemented by traces on resource board 44. A "local controller" 68, implemented within resource controller 50, can act as the local end of up to 52 virtual signal paths linking terminals of FPGAs F1–F8 to terminals of other emulation resources external to the resource board. Local controller 68 responds to incoming force commands conveyed in packets received via network interface 56 by driving selected lines of local bus 66 to states indicating by the force commands. Local controller 68 also responds to incoming read commands by reading states of lines of local bus 66 and returning a packet containing data indicating the line states to the network device that sent the read command. Local controller 68 can read states of lines of local bus 66 and then send a force command to a local controller within another resource board telling it to drive selected signals to those states. Local controller 68 can also send out read commands to a local controller of another resource board requesting it to return states of lines of its local bus so that local controller 68 can drive lines its local bus 66 to similar states.

Figure 12:
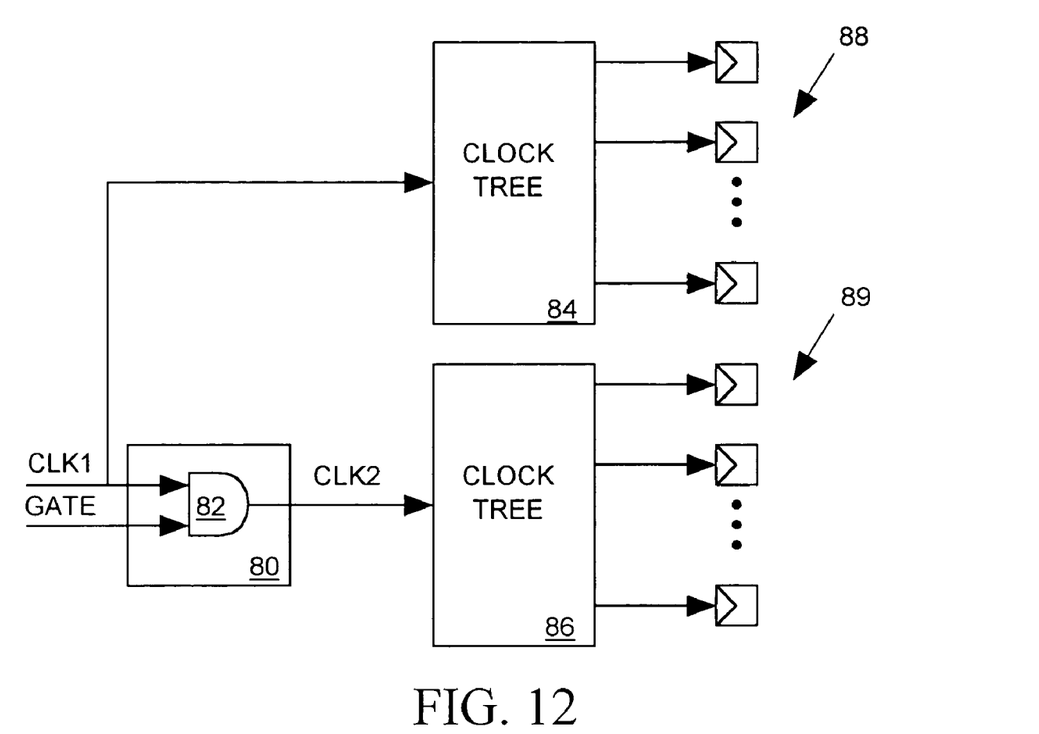
FIG. 12 illustrates an example clock logic circuit in block diagram form.

Resource controller 50 can also emulate portions of the IC being emulated, and is particularly suited for emulating the IC's clock logic circuits. A typical digital IC will employ register transfer logic in which various blocks of logic communicate through registers and other clocked devices to provide a high level of timing synchronization between the logic blocks. An IC will receive one or more primary clock signals as inputs, but may include clock logic circuit for deriving one or more secondary clock signals from its primary clock signals. For example FIG. 12 illustrates an example clock logic circuit 80 as might be included in an IC for processing a primary clock signal CLK1 and a clock gate signal GATE to produce a secondary clock signal CLK2. In this simple example, clock logic circuit 80 consists of an AND gate 82 producing the CLK signal of similar phase and frequency as the CLK signal when the GATE signal is high, and turning off the CLK2 signal when the GATE signal is low. But clock logic circuits can include many more inputs and more complicated clock logic. A pair of clock trees 84 and 86 (networks of conductors and buffers) deliver the CLK1 and CLK2 clock signal to the clock inputs of various clocked devices 88 and 89, such as registers and flip-flops, that may be used for controlling the timing of data signals passing between various blocks of logic within the IC. In an IC clock trees 84 and 86 are balanced so that edges of clock signal CLK1 arrive concurrently at clocked devices 88 and edges of the CLK2 clock signal arrive concurrently at clocked devices 89.

In resource board 44 of FIG. 5, programmable logic within resource controller 50 can emulate clock logic circuit 80, logic within FPGAs F1–F8 emulate clocked devices 88 and 89, and balanced signal on resource board 44 extending from clock logic circuit 80 to FPGAs F1–F8 and signal paths inside the FPGAs emulate the balanced clock trees 84 and

86. Resource board 44 of FIG. 5 includes a pair of oscillators 54 for generating clock signals for use as primary clock signals. A connector J9 provides a point of entry for other primary clock signals from external circuits. Buffers 55 buffer the clock signals produced by oscillators 54 and received via connector J9 FPGAs F1–F8. Workstation 44 or any other resource board can also send "virtual clock signal edges" to resource board 44 via a virtual signal path, and resource controller 50 can supply such a virtual clock signal as an input to the clock logic it implements.

Figure 9:
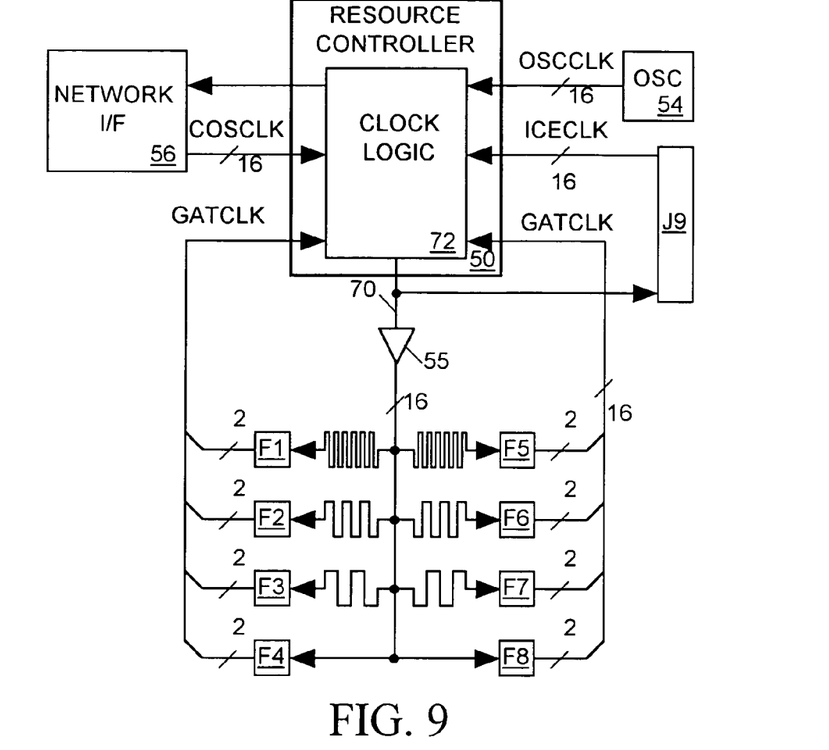

FIG. 9 illustrates a 16-line clock bus 70 for delivering to FPGAs F1–F8 via buffers 55 up to 16 clock signals produced by clock logic circuits 72 implemented within resource controller 50. Clock logic circuits 72 can receive clock signal inputs from several sources. Oscillators 54 supply primary clock signals (OSCCLK) of up to 16 different frequencies to clock logic circuit 70. External circuits can also supply up to 16 different clock signals (ICECLK) as inputs to clock logic circuits 72 via connector J9 and buffers 56. Workstation 42 and other resource boards 44 of FIG. 4 can supply up to sixteen different clock signals (COSCLK) to clock logic circuit 72 via virtual signal paths. Workstation 42 programs clock logic circuit 72 to process its input primary clock signals to generate and supply up to 16 clock signals to FPGAs F1–F8 via clock bus 70. Clock bus 70 is a star bus having a uniform signal path length from resource controller 50 to each FPGA F1–F8, thereby ensuring that edges of each clock signal arrive concurrently at all FPGAs F1–F8. Another pair of conductors delivers up to two signals (GATCLK) from each FPGA F1–F8 back to clock logic circuit 72 for use as clock gating signals. Clock gating signals can, for example, turn a secondary clock signal input to FPGAs F1–F8 on or off, or switch the reference source of the secondary clock signal to another primary clock signal input of clock logic circuit 72.

Figure 10:
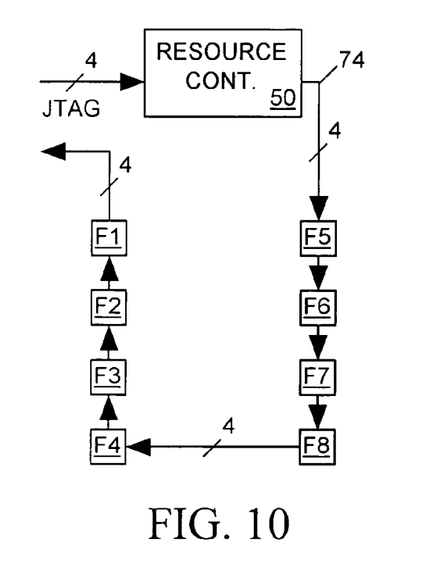

FIG. 10 illustrates traces 74 on the resource board implementing a 4-line JTAG bus for linking resource controller 50 and JTAG terminals of FPGAs F1–F8 to external host equipment. The host equipment can use the JTAG bus to initially load a bootstrap program into resource controller 50 and can also use the JTAG bus to monitor states of signals within resource controller 50 or any of FPGAs F1–F8 for diagnostic purposes.

Figure 11:
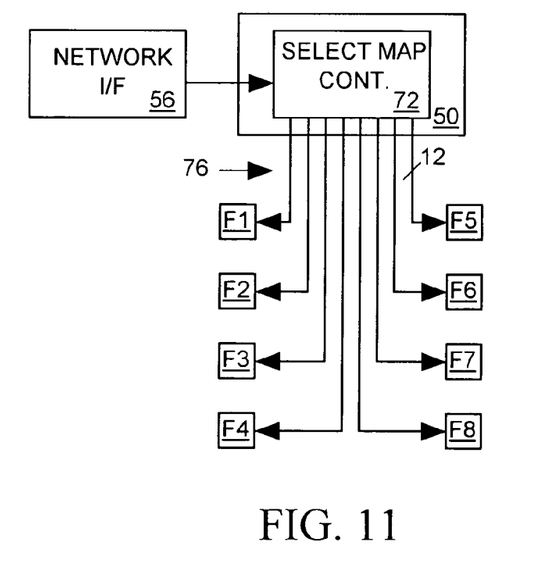

FIG. 11 illustrates traces 76 on resource board 44 implementing a set of 12-line buses connecting a "select map" input of each FPGA F1–F8 to a select map controller 72 implemented within resource controller 50. During the emulator programming process, select map controller 72 receives FPGA programming data via download commands conveyed by packets addressed to FPGAs F1–F8 from the workstation and loads the programming data into the addressed FPGA via the appropriate select map bus 70. Programming data delivered by packets can also reprogram selected FPGAs F1–F8 to accommodate changes in the design of the IC being emulated without having to reprogram the entire emulator.

Thus has been shown and described and example emulation resource board in accordance with the invention for holding a set of PLDs and RAMs and providing both hard-wired and virtual signal paths to flexibly route signals between the PLDs and RAMS and resources mounted on other resource boards, workstations and other external equipment. The resource board also provides the logic and balanced signal paths needed to deliver clock signals to the PLDs, and reduces the number of signals needed to communicate with external test equipment by implementing much of the pattern generation and data acquisition functionality needed to test an emulated circuit.

The foregoing specification and the drawings depict an exemplary embodiment of the best mode of practicing the invention, and elements or steps of the depicted best mode exemplify the elements or steps of the invention as recited in the appended claims. However the appended claims are not necessarily limited to the exemplary embodiment of the invention described above. For example, since many kinds of PLDs, memories and other emulation resources are known, those of skill in the art will appreciate that while the example emulation board described above holds and interconnects eight FPGAs and eight RAMs, an emulation resource board in accordance with the invention may include more or fewer FPGAs and RAMs, may include PLDs and memories other than FPGAs and RAMs, and may include other types of emulation resources in addition to or in lieu of PLDs and RAMs. The claims are therefore intended to apply to any mode of practicing the invention comprising the combination of elements or steps as described in any one of the claims, including elements or steps that may be functional equivalents of the example elements or steps of the exemplary embodiment of the invention depicted in the specification and drawings.

The invention claimed is:

1. An apparatus for performing an emulation of an electronic circuit and for transmitting and receiving, via a network, packets conveying data relating to the emulation, the apparatus comprising:
   a circuit board;
   at least one emulation resource mounted on the circuit board, each for emulating a behavior of at least a portion of the electronic circuit by producing output signals in response to input signals in a manner controlled by input programming data, each emulation resource having a network address;
   a resource interface circuit mounted on the circuit board for controlling states of the input signals in response to force commands received as input; and
   a network interface circuit mounted on the circuit board for receiving packets via the network, each packet conveying a destination address and a force command and for providing as input the resource interface circuit force commands conveyed in each received packet that also conveys a destination address matching a network address of the at least one emulation.

2. The apparatus in accordance with claim 1 further comprising random access memory (RAN) mounted on the circuit board,
   wherein the resource interface circuit stores state data representing states of output signals produced by the at least one emulation resource in the RAM during the emulation and
   wherein the network interface circuit thereafter transmits on the network packets conveying the state data stored in the RAM.

3. the apparatus in accordance with claim 1 further comprising random access memory (RAM) mounted on the circuit board
   wherein data conveyed to the network interface in packets is written into the RAM prior to the emulation, and
   wherein during the emulation the resource interface also controls states off inputs signals it transmits to the at least one emulation resource in response data stored in the RAM.

4. The apparatus in accordance with claim 1 wherein the resource interface circuit also supplies programming data conveyed by packets received at the network interface circuit via the network as the input programming data to the at least one emulation resource.

5. The apparatus in accordance with claim 1
wherein the at least the emulation resource comprises a plurality of programmable logic devices (PLDs), each having a plurality of terminals for receiving its input signals and the transmitting its output signals, and
wherein the apparatus further comprises a first plurality of signal paths formed on the circuit board linking a first subset of the terminals of each PLD to terminals or others of the PLOs for conveying their output signals to one another.

6. The apparatus in accordance with claim 5 wherein each PLD comprises a field programmable gate array (FPGA).

7. The apparatus in accordance with claim 5 further comprising:
a bus, formed on the circuit board and connected in parallel to a second subset of the terminals of each PLD, for conveying input and output signals between each PLD and the resource interface circuit.

8. The apparatus in accordance with claim 5
wherein the resource interface circuit generates at least one clock signal, and
wherein the apparatus further comprises a clock bus connected between the resource interface circuit and each PLD for concurrently delivering edges of the at least one clock signal to each PLD the clocking Logic circuits within the PLDs during the emulation.

9. The apparatus in accordance with claim 8 wherein the resource interface circuit generates edges of the at least one clock signal in response to packets received via the network.

10. The apparatus in accordance wherein claim 8 wherein the resource interface circuit receives a primary clock signal generated external to the apparatus and generates edges of the at least one clock signal in response to edges of the primary clock signal.

11. The apparatus in accordance wherein claim 8 further comprising an oscillator mounted on the circuit board for generating a primary clock signal, wherein the resource interface circuit generates edges of the at least one clock signal in response to edges of the primary clock signal.

12. The apparatus in accordance with claim 8 further comprising conductors mounted on the circuit board for conveying at least output signal of each PLD as a clock gating signal input to the resource interface circuit, wherein the resource interface circuit generates the at least one clock signal as a function of a clock gating signal received from at least one of the PLDs.

13. The apparatus in accordance with claim 5 further comprising:
a plurality of cable connectors, each corresponding to a separate one of the PLDs, and
signal paths coupling each cable connector to a second portion of the terminals of its corresponding PLD.

14. The apparatus in accordance with claim 5 further comprising:
a plurality of random access memories (RAMs), each corresponding to a separate ewe of the PLDs, and
signal paths coupling each RAM to a second portion of the terminals of its corresponding PLD such that each PLD can read and write access its corresponding RAM when programmed to do so.

15. The apparatus in accordance with claim 5 further comprising:
a plurality of cable connectors, each corresponding to a separate of the PLDs,
signal paths coupling each cable connector to a second portion of the terminals of its corresponding PLD,
a plurality of random access memories (RAMs), each corresponding to a separate one of the PLDs, and
a plurality of switches (S1–S8), each corresponding to a separate one to the RAMS, each selectively coupling the corresponding RAM to the second portion of the terminals of the PLD corresponding to that RAM such that when coupled to its corresponding RAM, each PLD can read and write access it when programmmed to do so.

16. The apparatus in accordance with claim 15 wherein the resource interface circuit controls the plurality of switches in response to data conveyed in packets received via the network.

17. The apparatus in accordance with claim 6
wherein the resource interface circuit generates at least one clock signal,
wherein the apparatus further comprises:
a local bus, formed on the circuit board and connected in parallel to a second subset of the terminals of each FPGA, for conveying input and output signals between each and the resource interface circuit;
a clock bus mounted on the circuit board for concurrently delivering edges of the at least one clock signal to each FPGA for clocking logic circuits within the PLDs during the emulation; and
conductors mounted on the circuit board for conveying at least output signal of each FPGA as a clock gating signal input to the resource interface circuit, wherein the resource interface circuits generates the at least one clock signal as a function of a clock gating signal received from at least one of the EPGAs.

18. The apparatus in accordance with claim 17 further comprising:
a plurality of cable connectors, each corresponding to a separate of the FPGA s;
signal paths coupling each cable connector to a second portion of the terminals of its corresponding FPGA;
a plurality of random access memories (RAMs), each corresponding to a separate one of the FPGA s; and
a plurality of switches, each corresponding to a separate one of the RAMs, each selectively coupling the corresponding RAM to the second portion of the terminals of the FPGA corresponding to that RAM such that when coupled to its corresponding RAM, each FPGA can read and write access it when programmed to do so, wherein the resource interface circuit controls the plurality of switches in response to data conveyed in packets received via the network.

19. The apparatus in accordance with claim 17 wherein the resource interface circuit generates edges of the at least one clock signal in response to packets received via the network.

20. The apparatus in accordance wherein claim 17 wherein the resource interface circuit receives a primary clock signal generated external to the apparatus and generates edges of the at least one clock signal in response to edges of the primary clock signal.

21. The apparatus in accordance wherein claim 17 further comprising:
an oscillator mounted on the circuit board for generating a primary clock signal, wherein the resource interface circuit generates edges of the at least one clock signal in response to edges of the primary clock signal.

22. The apparatus in accordance with claim 17 further comprising:

random access memory (RAM) mounted on the circuit board, wherein the resource interface circuit stores data conveyed by packets arriving via the network in the RAM prior to performing the emulation, and then controls states of inputs signals it transmits to the at least one emulation resource in response to the data it stored in the RAM.

23. The apparatus in accordance with claim 17 further comprising:

random access memory (RAM) mounted on the circuit board, wherein the resource interface circuit stores data representing slates of output signais produced by the at least one emulation resource in the RAM during the emulation and thereafter transmits on the network pockets conveying the data it stored in the RAM.

24. The apparatus in accordance with claim 15 further comprising:

another switch (S9) for selectively interconnecting signal paths between the second portion of the terminals of at least two of the PLDs.

25. An apparatus for performing art emulation of an electronic circuit and for transmitting and receiving, via a network, packets conveying data relating to the emulation, the apparatus comprising:

a circuit board;

at least one emulation resource mounted on the circuit board, each for emulating a behavior of at least a portion of the electronic circuit by producing output signals in response to input signals in a manner controlled by input programming data, each emulation resource having a network address;

a resource interface circuit mounted on the circuit board for responding to an input read commmand by generating state data indicating states of the output signals of the at least one emulation resource; and a network interface circuit mounted on the circuit board for receiving packets via the network, each packet conveying a source address, a destination address and a read command, for providing as input to the resource interface circuit read commands conveyed in each received packet that also conveys a destination address matching a network address of the at least one emulation resource, receiving the state data generated by the resources interface circuit an response to the read command and transmitting via the network a packet conveying the state data and a destination address matching the source address conveyed by the packet that conveyed the read command.

* * * * *

UNITED STATES PATENT AND TRADEMARK OFFICE
CERTIFICATE OF CORRECTION

PATENT NO. : 7,120,571 B2
APPLICATION NO. : 10/735342
DATED : October 10, 2006
INVENTOR(S) : Sweyyan Shei et al.

It is certified that error appears in the above-identified patent and that said Letters Patent is hereby corrected as shown below:

Column 12
Line 48, "(RAN)" should be deleted and replaced with --(RAM)--.
Line 57, "the" should be deleted and replaced with --The--.
Line 62, "interface" should be deleted and replaced with --interface circuit--.
Line 64, "response data" should be deleted and replaced with --response to the data--.

Column 13
Line 5, "at least the" should be deleted and replaced with --at least one--.
Line 8, "and the" should be deleted and replaced with --and for--.
Line 11, "terminals or" should be deleted and replaced with --terminals of--.
Line 12, "PLOs" should be deleted and replaced with --PLDs--.
Line 27, "PLD" should be deleted and replaced with --PLD,--.
Line 28, "the clocking Logic" should be deleted and replaced with --for clocking logic--.
Line 45, "at least output" should be deleted and replaced with --at least one output--.
Line 59, "separate ewe" should be deleted and replaced with --separate one--.
Line 67, "separate of" should be deleted and replaced with --separate one of--.

Column 14
Line 23, "each and" should be deleted and replaced with --each FPGA and--.
Line 29, "at least output" should be deleted and replaced with --at least one output--.
Line 37, "separate of the FPGA s" should be deleted and replaced with --separate one of the FPGAs--.
Line 41, "FPGA s" should be deleted at replaced with --FPGAs--.
Line 60, "wherein" should be deleted and replaced with --with--.

Column 15
Line 15, "pockets" should be deleted and replaced with --packets--.
Line 21, "art" should be deleted and replaced with --an--.

UNITED STATES PATENT AND TRADEMARK OFFICE
CERTIFICATE OF CORRECTION

PATENT NO. : 7,120,571 B2
APPLICATION NO. : 10/735342
DATED : October 10, 2006
INVENTOR(S) : Sweyyan Shei et al.

It is certified that error appears in the above-identified patent and that said Letters Patent is hereby corrected as shown below:

Column 16
Line 6, "commmand" should be deleted and replaced with --command--.
Line 20, "an" should be deleted and replaced with --in--.

Signed and Sealed this

Nineteenth Day of December, 2006

JON W. DUDAS
*Director of the United States Patent and Trademark Office*